US012575365B2

(12) United States Patent
Genetti et al.

(10) Patent No.: US 12,575,365 B2
(45) Date of Patent: Mar. 10, 2026

(54) EDGE RING TRANSFER WITH AUTOMATED ROTATIONAL PRE-ALIGNMENT

(71) Applicant: LAM RESEARCH CORPORATION, Fremont, CA (US)

(72) Inventors: Damon Tyrone Genetti, Livermore, CA (US); Darryl Angelo, Sunnyvale, CA (US); Richard H. Gould, Fremont, CA (US); Roy Scott Powell, Campbell, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 761 days.

(21) Appl. No.: 17/793,715

(22) PCT Filed: Jan. 20, 2021

(86) PCT No.: PCT/US2021/014089
§ 371 (c)(1),
(2) Date: Jul. 19, 2022

(87) PCT Pub. No.: WO2021/150548
PCT Pub. Date: Jul. 29, 2021

(65) Prior Publication Data
US 2023/0047039 A1 Feb. 16, 2023

Related U.S. Application Data

(60) Provisional application No. 62/964,908, filed on Jan. 23, 2020.

(51) Int. Cl.
H01L 21/68 (2006.01)
H01L 21/67 (2006.01)
(Continued)

(52) U.S. Cl.
CPC .... H01L 21/67742 (2013.01); H01L 21/6719 (2013.01); H01L 21/6773 (2013.01);
(Continued)

(58) Field of Classification Search
CPC ........... H01L 21/67742; H01L 21/6719; H01L 21/6773; H01L 21/67763; H01L 21/681; H01L 21/68735
(Continued)

(56) References Cited

U.S. PATENT DOCUMENTS

| | | | |
|---|---|---|---|
| 9,269,529 | B2 | 2/2016 | Rodnick et al. |
| 10,665,490 | B2 | 5/2020 | Lee et al. |

(Continued)

FOREIGN PATENT DOCUMENTS

| | | |
|---|---|---|
| KR | 1020200004684 A | 1/2020 |
| TW | 201029070 A | 8/2010 |

(Continued)

OTHER PUBLICATIONS

Taiwanese Office Action for Taiwan Application No. 110102253 dated Oct. 14, 2024.

(Continued)

*Primary Examiner* — Charlee J. C. Bennett

(57) ABSTRACT

A system includes a robot configured to transfer either one of a substrate and an edge ring within a substrate processing system, a substrate aligner configured to adjust a rotational position of either one of the substrate or the edge ring relative to an end effector of the robot, and a carrier plate configured to support the edge ring. The robot is configured to retrieve the carrier plate with the end effector, retrieve the edge ring using the carrier plate supported on the end effector, and transfer the carrier plate and the edge ring to the substrate aligner.

26 Claims, 8 Drawing Sheets

(51) Int. Cl.
  *H01L 21/677*   (2006.01)
  *H01L 21/687*   (2006.01)
(52) U.S. Cl.
  CPC ...... *H01L 21/67763* (2013.01); *H01L 21/681*
     (2013.01); *H01L 21/68735* (2013.01)
(58) Field of Classification Search
  USPC ......................................................... 118/729
  See application file for complete search history.

(56)       References Cited

U.S. PATENT DOCUMENTS

| | | | |
|---|---|---|---|
| 11,501,994 B2* | 11/2022 | Lee .................. | H01L 21/68735 |
| 2005/0071990 A1* | 4/2005 | Nakamura ........ | H01L 21/67259 |
| | | | 29/721 |
| 2006/0120833 A1* | 6/2006 | Bonora ............. | H01L 21/67766 |
| | | | 414/217 |
| 2012/0315113 A1* | 12/2012 | Hiroki .............. | H01L 21/68707 |
| | | | 414/217 |
| 2015/0262786 A1* | 9/2015 | Nakai .................. | H01J 37/226 |
| | | | 216/95 |
| 2016/0172165 A1* | 6/2016 | Jeon .................. | H01J 37/32733 |
| | | | 118/728 |

| | | | |
|---|---|---|---|
| 2017/0113355 A1 | 4/2017 | Genetti et al. | |
| 2017/0330786 A1* | 11/2017 | Genetti ............. | H01L 21/67201 |
| 2018/0068879 A1 | 3/2018 | Wong et al. | |
| 2018/0138069 A1* | 5/2018 | Tan ................... | H01L 21/67248 |
| 2019/0088531 A1* | 3/2019 | Sarode Vishwanath ..................... | |
| | | | H01J 37/32623 |
| 2019/0109031 A1 | 4/2019 | Sugawara | |
| 2019/0252234 A1 | 8/2019 | Genetti et al. | |
| 2020/0373194 A1* | 11/2020 | Volfovski .......... | H01L 21/67748 |
| 2020/0411347 A1* | 12/2020 | Kopec .............. | H01L 21/67196 |
| 2022/0246408 A1* | 8/2022 | Genetti ............ | H01J 37/32908 |
| 2025/0104979 A1* | 3/2025 | Akama ............. | H01J 37/32834 |

FOREIGN PATENT DOCUMENTS

| | | |
|---|---|---|
| TW | 201541545 A | 11/2015 |
| TW | 201726509 A | 8/2017 |
| TW | 201825704 A | 7/2018 |
| WO | WO-2010054076 A2 | 5/2010 |
| WO | WO-2020247146 A1 | 12/2020 |

OTHER PUBLICATIONS

International Search Report and Written Opinion of the ISA issued in PCT/US2021/014089, mailed May 12, 2021; ISA/KR.

* cited by examiner

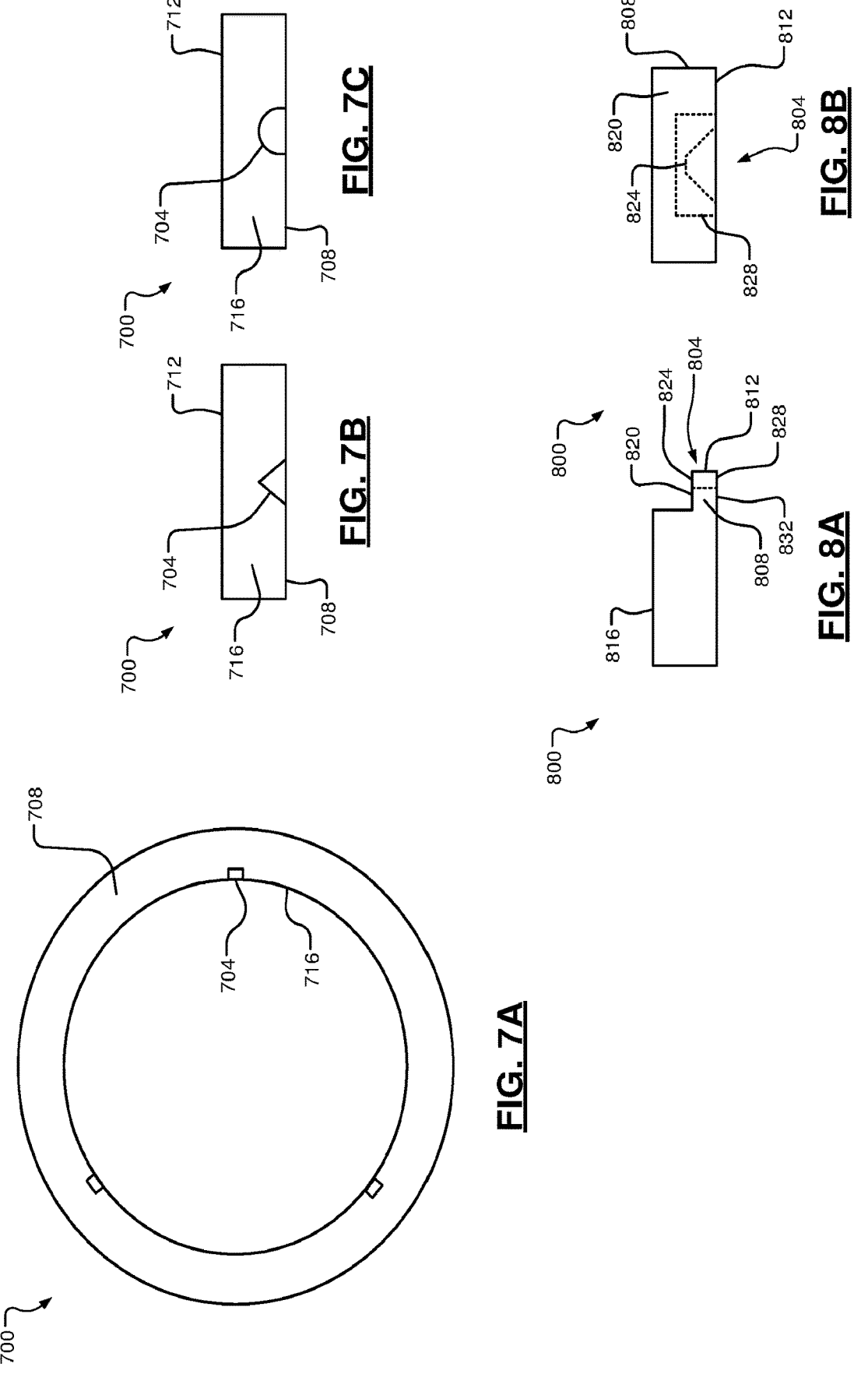

EDGE RING TRANSFER WITH AUTOMATED ROTATIONAL PRE-ALIGNMENT

CROSS-REFERENCE TO RELATED APPLICATIONS

This application is a U.S. National Phase Application under 35 U.S.C. 371 of International Application No. PCT/US2021/014089, filed on Jan. 20, 2021, which claims the benefit of U.S. Provisional Application No. 62/964,908, filed on Jan. 23, 2020. The entire disclosures of the applications referenced above are incorporated herein by reference.

FIELD

The present disclosure relates to systems and methods for aligning an edge ring in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a wafer. For example, the wafer may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect substrate support from erosion caused by the plasma, etc.

SUMMARY

A system includes a robot configured to transfer either one of a substrate or an edge ring within a substrate processing system, a substrate aligner configured to adjust a rotational position of either one of the substrate or the edge ring relative to an end effector of the robot, and a carrier plate configured to support the edge ring. The robot is configured to retrieve the carrier plate with the end effector, retrieve the edge ring using the carrier plate supported on the end effector, and transfer the carrier plate and the edge ring to the substrate aligner.

In other features, an imaging device is configured to detect a feature of the edge ring while the edge ring and the carrier plate are arranged on the substrate aligner. The feature is a flat region of an inner diameter of the edge ring. Surfaces of the edge ring are generally polished and the feature corresponds to at least one of an unpolished and roughened portion of the edge ring. Surfaces of the edge ring are generally unpolished and the feature corresponds to a polished portion of the edge ring. The feature includes a notch arranged on a bottom surface of the edge ring. The feature includes a window provided in the edge ring. The window permits transmission of light through the edge ring. The edge ring is coated and the feature corresponds to an uncoated portion of the edge ring. The edge ring is uncoated and the feature corresponds to a coated portion of the edge ring. The feature corresponds to at least one mark on a surface of the edge ring.

In other features, the substrate aligner is configured to rotate the carrier plate and the edge ring based on the feature of the edge ring detected by the imaging device. A dynamic alignment module is configured to determine the rotational position of the edge ring relative to the end effector based on the feature of the edge ring detected by the imaging device. The substrate aligner is configured to rotate the carrier plate and the edge ring based on the rotational position of the edge ring as determined by the dynamic alignment module. The substrate aligner is configured to rotate the carrier plate and the edge ring further based on a desired rotational position of the edge ring relative to the end effector.

In other features, the carrier plate includes a plurality of tabs extending from respective corners of a body of the carrier plate, a perimeter of the body is smaller than an inner diameter of the edge ring, and the plurality of tabs extend beyond the inner diameter of the edge ring. At least two of the plurality of tabs includes an elastomeric pad. A bottom surface of the carrier plate includes a contact sheet comprised of a thermoplastic material. The contact sheet is arranged in a recess in the bottom surface of the carrier plate. The carrier plate includes rounded corners. The rounded corners of the carrier plate define a perimeter corresponding to a diameter of the substrate. The diameter is approximately 300 mm.

A method includes controlling a robot within a substrate processing system to retrieve a carrier plate using an end effector of the robot, retrieve an edge ring using the carrier plate supported on the end effector, and transfer the carrier plate and the edge ring to a substrate aligner configured to adjust a rotational position of either one of a substrate or the edge ring, and adjusting the rotational position of the edge ring while the carrier plate and the edge ring are arranged on the substrate aligner.

In other features, the method further includes detecting a feature of the edge ring while the edge ring and the carrier plate are arranged on the substrate aligner. The feature is a flat region of an inner diameter of the edge ring. Surfaces of the edge ring are generally polished and the feature corresponds to at least one of an unpolished and roughened portion of the edge ring. Surfaces of the edge ring are generally unpolished and the feature corresponds to a polished portion of the edge ring. The edge ring is coated and the feature corresponds to an uncoated portion of the edge ring. The edge ring is uncoated and the feature corresponds to a coated portion of the edge ring. The feature corresponds to at least one mark on a surface of the edge ring.

In other features, the method further includes rotating the carrier plate and the edge ring based on the detected feature of the edge ring. The method further includes determining the rotational position of the edge ring relative to the end effector based on the detected feature of the edge ring and rotating the carrier plate and the edge ring based on the determined rotational position of the edge ring. The method further includes rotating the carrier plate and the edge ring further based on a desired rotational position of the edge ring relative to the end effector.

The carrier plate includes a plurality of tabs extending from respective corners of a body of the carrier plate, a perimeter of the body is smaller than an inner diameter of the edge ring and the plurality of tabs extend beyond the inner diameter of the edge ring, and retrieving the edge ring includes retrieving the edge ring such that an inner diameter of the edge ring is supported on the plurality of tabs. The carrier plate includes rounded corners. The rounded corners of the carrier plate define a perimeter corresponding to a diameter of the substrate. The diameter is approximately 300 mm.

A system includes a robot configured to transfer either one of a substrate or an edge ring within a substrate processing system, a substrate aligner configured to adjust a rotational position of either one of the substrate or the edge ring relative to an end effector of the robot, and a carrier plate configured to support the edge ring. The robot is configured to retrieve the carrier plate with the end effector and adjust a rotational alignment of the carrier plate on the end effector based on a detected feature of the carrier plate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 7A, 7B, and 7C show a bottom view and an inner diameter of another example edge ring including one or more alignment notches according to the present disclosure; and FIGS. 8A and 8B are a cross-sectional view and top view, respectively, of another example edge ring according to the present disclosure.

In the drawings, reference numbers may be reused to identify similar and/or identical elements.

DETAILED DESCRIPTION

A substrate support in a substrate processing system may include an edge ring. In some systems, a robot/handler (e.g., a vacuum transfer module (VTM) robot) used to transfer substrates to and from a substrate support within a processing chamber may also be configured to transfer edge rings to and from the processing chamber. For example, edge rings may be consumable (i.e., edge rings may wear out over time) and therefore are periodically replaced. The robot may be configured to install and remove edge rings from the substrate support. The substrate processing system may include one or more other robots configured to transfer edge rings within and between other components (e.g., a loading station, an equipment front end module (EFEM), a load lock, etc.).

Accurate placement of the edge ring on the substrate support may be difficult. Some substrate processing systems may implement a dynamic alignment (DA) system for aligning substrates on the substrate support using the robot. Example DA systems and methods are described in more detail in U.S. Pat. No. 9,269,529, which is incorporated by reference herein in its entirety. For example, DA systems and methods may implement an optical sensor to determine a position of a substrate on an end effector of the robot prior to placement on the substrate support. The DA system may further include a substrate aligner configured to adjust a rotational position of the substrate based on the determined position. Systems and methods according to the present disclosure perform rotational alignment of the edge ring using a robot and DA system configured to perform rotational alignment of a substrate.

Figure 1A:
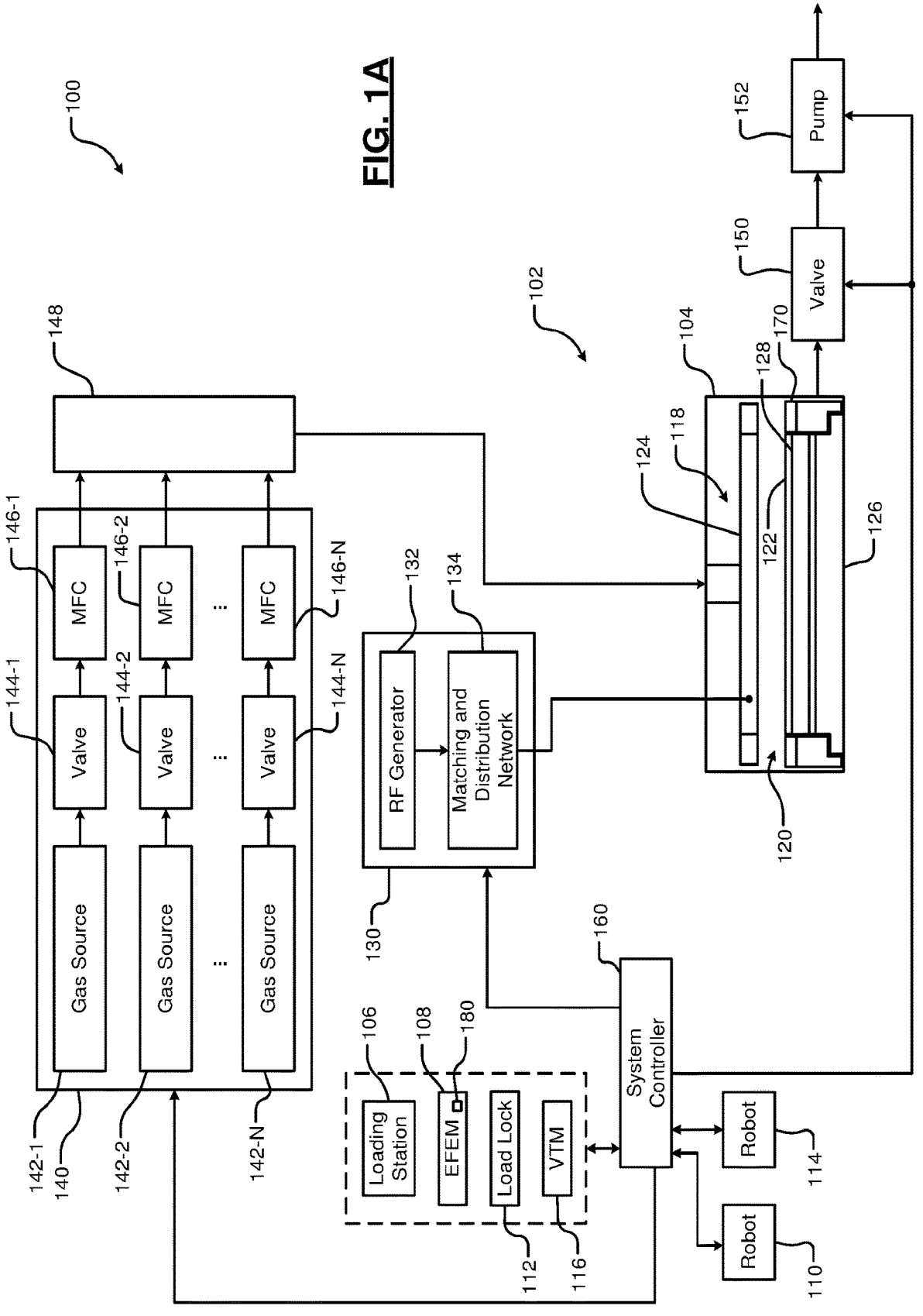
FIG. 1A is a functional block diagram of an example substrate processing system according to the present disclosure.
Figure 1B:
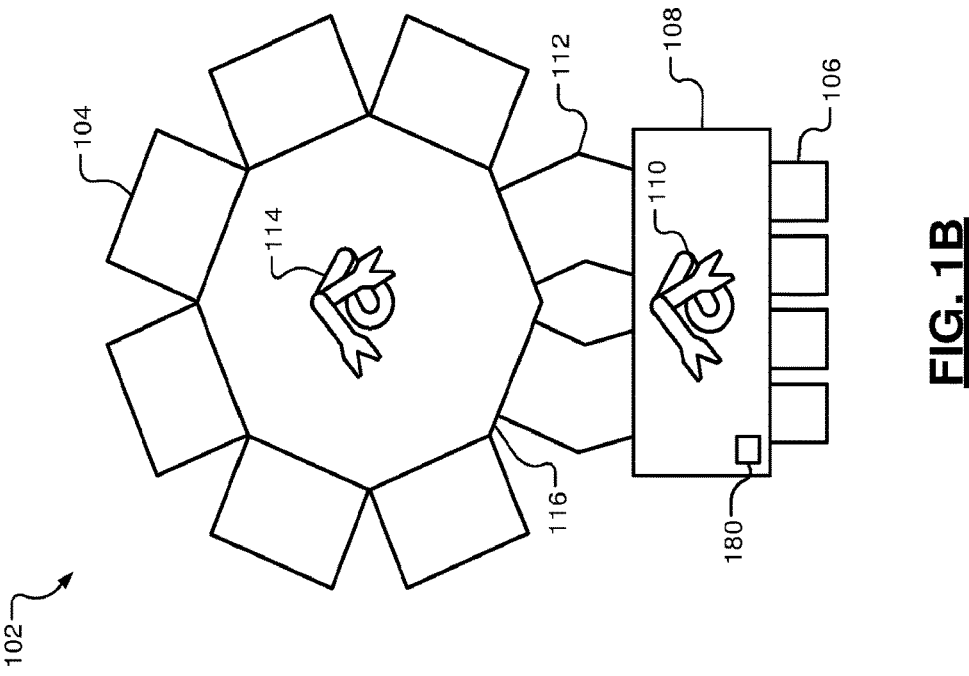
FIG. 1B illustrates an example substrate processing tool according to the present disclosure.

Referring now to FIGS. 1A and 1B, an example substrate processing system 100 including a substrate processing tool 102 is shown. FIG. 1B is a top-down view of the substrate processing tool 102. For example only, the substrate processing system 100 may be used for performing etching using RF plasma and/or other suitable substrate processing. The substrate processing system 100 includes one or more processing modules or chambers 104 that enclose other components of the substrate processing system 100 and contain the RF plasma.

Substrates to be processed are loaded into the substrate processing tool 102 via one or more intermediate chambers. For example, the substrates are loaded via ports of a loading station 106 of an atmosphere-to-vacuum (ATV) transfer module, such as an equipment front end module (EFEM) 108, and then transferred into one or more of the processing chambers 104. For example, a transfer robot 110 is arranged to transfer substrates from the loading stations 106 to airlocks, or load locks, 112, and a vacuum transfer robot 114 of a vacuum transfer module 116 is arranged to transfer substrates from the load locks 112 to the various processing chambers 104.

The processing chamber 104 includes an upper electrode 118 and a substrate support 120, such as an electrostatic chuck (ESC). During operation, a substrate 122 is arranged on the substrate support 120. While a specific substrate processing system 100 and processing chamber 104 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 118 may include a gas distribution device such as a showerhead 124 that introduces and distributes process gases. In other examples, the upper electrode 118 may include a conducting plate and the process gases may be introduced in another manner. The substrate support 120 includes a conductive baseplate 126 that acts as a lower electrode. The baseplate 126 supports a ceramic layer 128.

An RF generating system 130 generates and outputs an RF voltage to one of the upper electrode 118 and the lower electrode (e.g., the baseplate 126 of the substrate support 120). The other one of the upper electrode 118 and the baseplate 126 may be DC grounded, AC grounded or floating. For example only, the RF generating system 130 may include an RF voltage generator 132 that generates the RF voltage that is fed by a matching and distribution network 134 to the upper electrode 118 or the baseplate 126. In other examples, the plasma may be generated inductively or remotely. Although, as shown for example purposes, the RF generating system 130 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 140 includes one or more gas sources 142-1, 142-2, . . . , and 142-N (referred to collectively as gas sources 142), where N is an integer greater than zero. The gas sources supply one or more precursors and mixtures thereof. The gas sources may also supply purge gas. Vaporized precursor may also be used. The gas sources 142 are connected by valves 144-1, 144-2, . . . , and 144-N (referred to collectively as valves 144) and mass flow controllers 146-1, 146-2, . . . , and 146-N (referred to collectively as mass flow controllers 146) to a manifold 148. An output of the manifold 148 is fed to the processing chamber 104. For example only, the output of the manifold 148 is fed to the showerhead 124. A valve 150 and pump 152 may be used to evacuate reactants from the processing chamber 104.

A system controller 160 may be used to control components of the substrate processing system 100. For example, the system controller 160 is configured to control the robots 110 and 114 to transfer substrates within and between the loading station 106, the EFEM 108, the load lock 112, the VTM 116, and the processing chamber 104.

The substrate support 120 includes an edge ring 170. The edge ring 170 according to the principles of the present disclosure may be moveable (e.g., moveable upward and downward in a vertical direction) relative to the substrate support 120. For example, the edge ring 170 may be controlled via an actuator and lift pins (not shown) responsive to the system controller 160. The system controller 160 and the vacuum transfer robot 114 may be further configured to transfer the edge ring 170 between the load lock 112 and the substrate support 120 of a respective processing chamber 104. Conversely, the system controller 160 and the transfer robot 110 may be configured to transfer the edge ring 170 between one of the loading stations 106, the EFEM 108, and the load lock 112.

The substrate processing system 100 may include one or more integrated substrate aligners 180. As shown, the substrate aligner 180 is located within the EFEM 108. In other examples, the substrate aligner 180 may be located within other chambers, such as the vacuum transfer module 116. The substrate processing system 100 according to the present disclosure is configured to perform rotational alignment of the edge ring 170 using the system controller 160, the transfer robot 110, and the substrate aligner 180 as described below in more detail.

Figure 2:
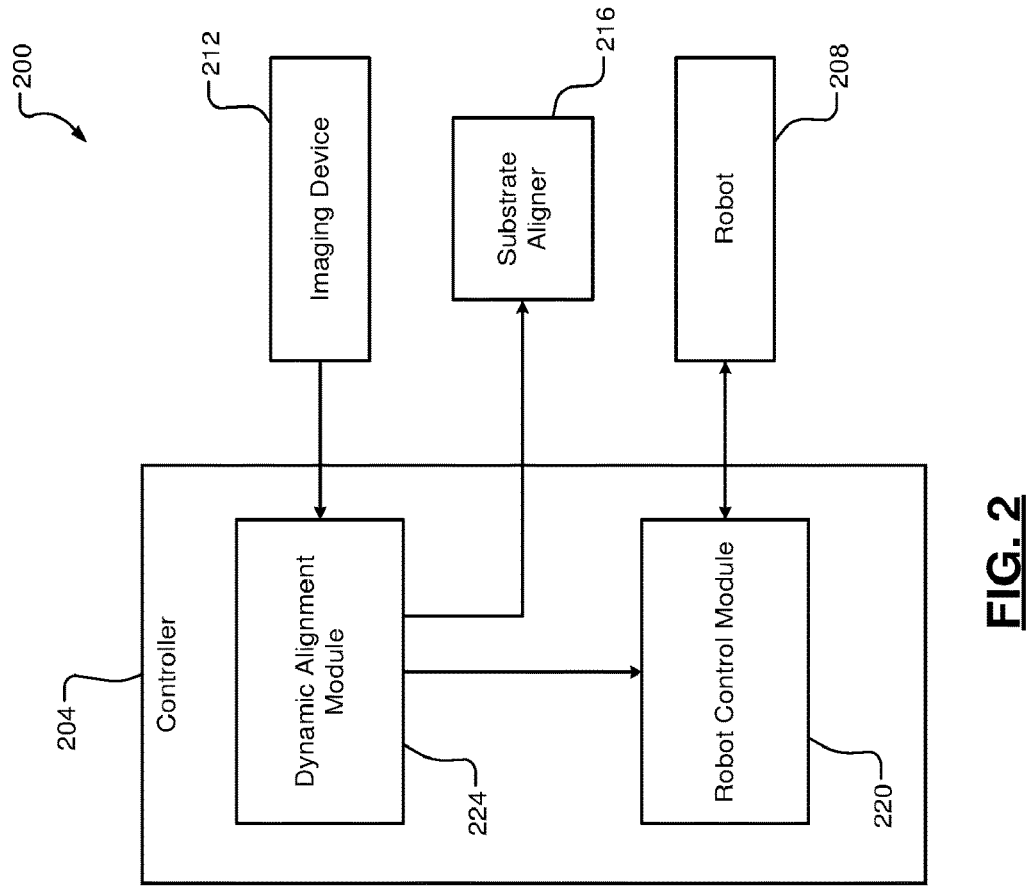
FIG. 2 is an example edge ring alignment system according to the present disclosure.

Referring now to FIG. 2, an example edge ring alignment system 200 according to the principles of the present disclosure is shown. The system 200 includes a controller 204 (e.g., corresponding to the controller 160 of FIG. 1A), a robot 208 (e.g., corresponding to the transfer robot 10 of FIGS. 1A and 1B), and an imaging device 212. For example, the imaging device 212 includes a camera, sensor, etc. configured to detect objects within a viewing area. The imaging device 212 may be arranged on or near a substrate aligner 216 within a chamber such as the EFEM 108.

The controller 204 may include a robot control module 220 and a dynamic alignment (DA) module 224. The robot control module 220 controls the robot 208. For example, the robot control module 220 controls the robot 208 to transfer substrates and edge rings between various process modules/chambers, vacuum chambers, etc. The robot 208 according to the principles of the present disclosure includes an end effector configured to place and retrieve edge rings. For example, the robot 208 retrieves an edge ring and transfers the edge ring from the loading station 106, through the EFEM 108, and to the load lock 112. During the transfer, the edge ring is arranged on the substrate aligner 216 in a viewing area of the imaging device 212 to detect a rotational position of the edge ring on the end effector. In some examples, the substrate aligner 216 may be integrated with a robot assembly including the robot 208.

In one example, the imaging device 212 may project one or more beams toward an end effector of the robot 208, sense when an edge ring interrupts the beams, and determine a position of the edge ring on the end effector based on a pattern indicative of which beams are interrupted. For example, the pattern may be compared to a predetermined pattern indicative of a desired rotational position on the end effector to determine a rotational alignment of the edge ring. In other examples, the imaging device 212 may detect features on the edge ring, the end effector, an adapter or carrier plate, and/or other structure to determine a rotational position of the edge ring on the end effector.

The DA module 224 receives position detection data from the imaging device 212. For example, the position detection data may include data indicative of beam patterns generated when the edge ring passed through the viewing area of the imaging device 212, detected features on the edge ring, end effector, a carrier plate, etc., and/or other data indicative of a rotational position of the edge ring on the end effector. The DA module 224 is configured to calculate position information including an actual rotational position of the edge ring on the end effector and a rotational offset between the actual rotational position and a desired rotational position on the end effector based on the position detection data. The DA module 224 may be further configured to control the substrate aligner 216 to rotate the edge ring based on the position information until the edge ring is in a position corresponding to the desired rotational position on the end effector. The robot 208 retrieves the edge ring with the end effector when the edge ring is in the position corresponding to the desired rotational position.

Typically, end effectors are configured to support transfer substrates. In other words, an end effector may be configured to support a disc-like object such as a substrate and not configured to support an annular object such as an edge ring. Further, edge rings for a specific substrate support typically have a greater diameter than substrates sized for the same substrate support. Similarly, the substrate aligner 216 may be configured to support a substrate but not an edge ring. Accordingly, the alignment system 200 according to the present disclosure implements an adapter or carrier (hereinafter, "a carrier plate") configured to provide a support interface for the edge ring on the end effector and/or the substrate aligner.

Figures 3A, 3B, 3C:
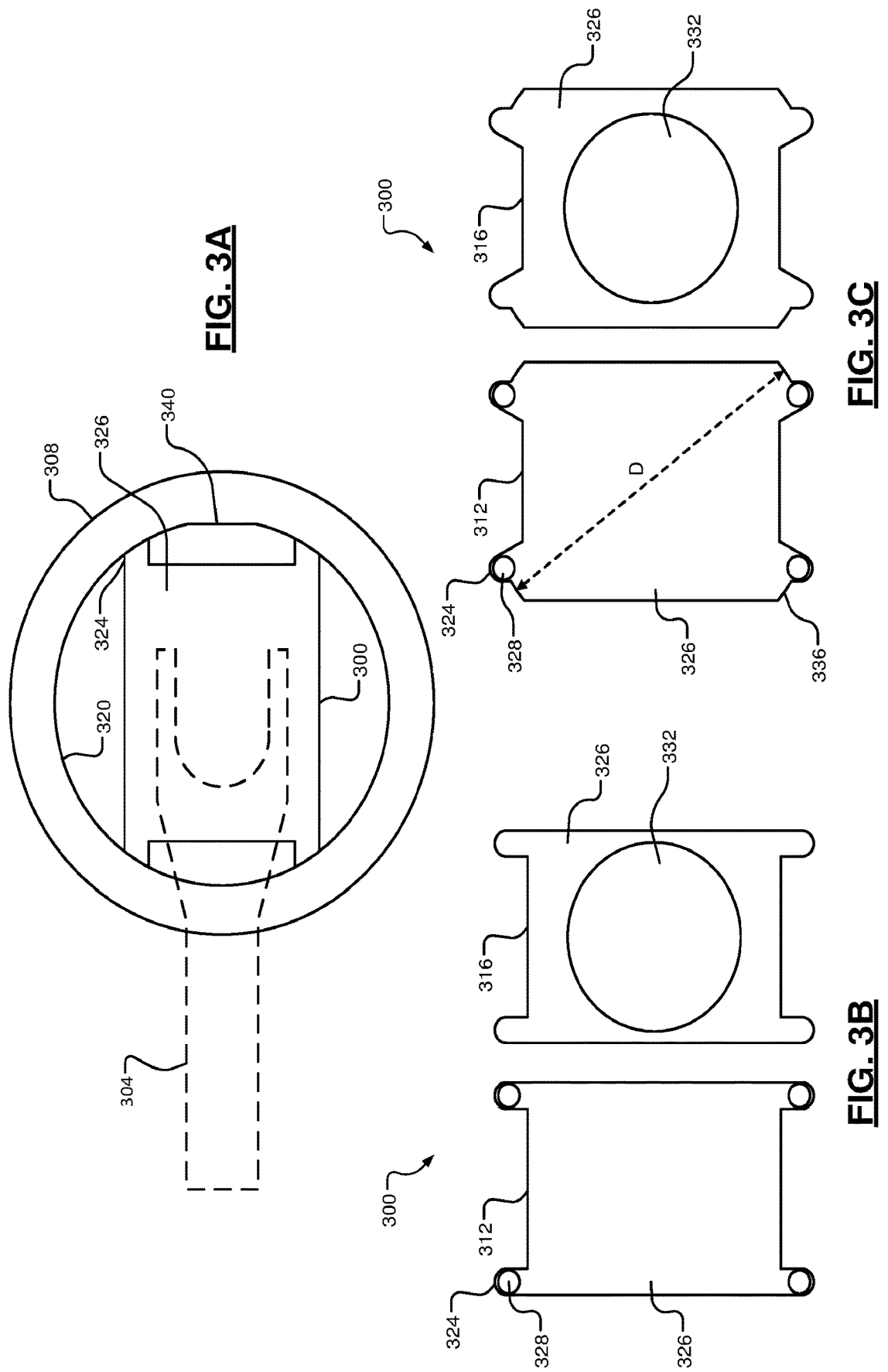
FIGS. 3A, 3B, and 3C illustrate an example carrier plate according to the present disclosure.

Referring now to FIGS. 3A, 3B, and 3C, an example carrier plate 300 is shown. In FIG. 3A, the carrier plate 300 is shown supported on an end effector 304 of a robot (e.g., the robot 208 of FIG. 2) and an edge ring 308 is supported on the carrier plate 300. Views of a top surface 312 and bottom surface 316 of examples of the carrier plate 300 are shown in FIGS. 3B and 3C. The carrier plate 300 may be comprised of a lightweight material that provides high stiffness and low deflection, such as carbon fiber, while minimizing load deflection of the end effector 304.

The carrier plate 300 provides support for the edge ring 308 on the end effector 304. For example, the carrier plate 300 is configured to interface with an inner diameter 320 of the edge ring 308. For example only, the carrier plate 300 includes a plurality of fingers or tabs 324 extending from respective corners of a rectangular body 326 of the carrier plate 300. Each of (or at least two of) the tabs 324 may include a gripping surface, such as an elastomeric pad 328, on the top surface 312 of the carrier plate 300. The pads 328 facilitate retention of the edge ring 308 and prevent slipping.

Conversely, the bottom surface 316 of the carrier plate 300 may include a contact sheet 332. For example only, the contact sheet 332 is comprised of a thermoplastic such as polyether ether ketone (PEEK). The contact sheet 332 provides a contact interface between the carrier plate 300 and the end effector 304 and the substrate aligner 216. In some examples, the contact sheet 332 may be arranged in a recess on the bottom surface 316.

The carrier plate 300 is sized in accordance with dimensions of the edge ring 308. For example, the carrier plate 300 is sized in accordance with the inner diameter 320 of the edge ring 308. In other words, a perimeter of the rectangular body 326 may be smaller than (i.e., located within) the inner diameter 320 while the tabs 324 extend beyond the inner diameter 320. In an example where the inner diameter is approximately 300 mm (e.g., 295-305 mm, for a substrate support configured for 300 mm substrates), the tabs 324 extend beyond a perimeter corresponding to a 300 mm diameter.

In the example shown in FIG. 3C, the carrier plate 300 includes beveled or rounded corners 336. For a substrate aligner configured for 300 mm substrates, the imaging device 212 may be configured to have a viewing area positioned above the outer diameter of the substrate. Accordingly, the carrier plate 300 may be configured to have dimensions corresponding to the substrates being aligned on the substrate aligner 216. For example, the rounded corners 336 define a perimeter that corresponds to a desired diameter D (e.g., 300 mm). In other words, the rounded corners 336 define a perimeter or arc generally corresponding to a same diameter (e.g., 300 mm) as the substrate. Accordingly, a system configured to detect an outer perimeter of a 300 mm substrate can also detect the rounded corners 336 to facilitate detection and alignment of the carrier plate 300. Further, the carrier plate 300 and/or the edge ring 308 may include one or more features (e.g., a flat region 340 on the inner diameter 320 of the edge ring 308) that are detectable by the imaging device 212. In this manner, the carrier plate 300 is configured to facilitate positioning and alignment on the substrate aligner 216 and detection by the imaging device 212 as described below in more detail.

Figure 4A:
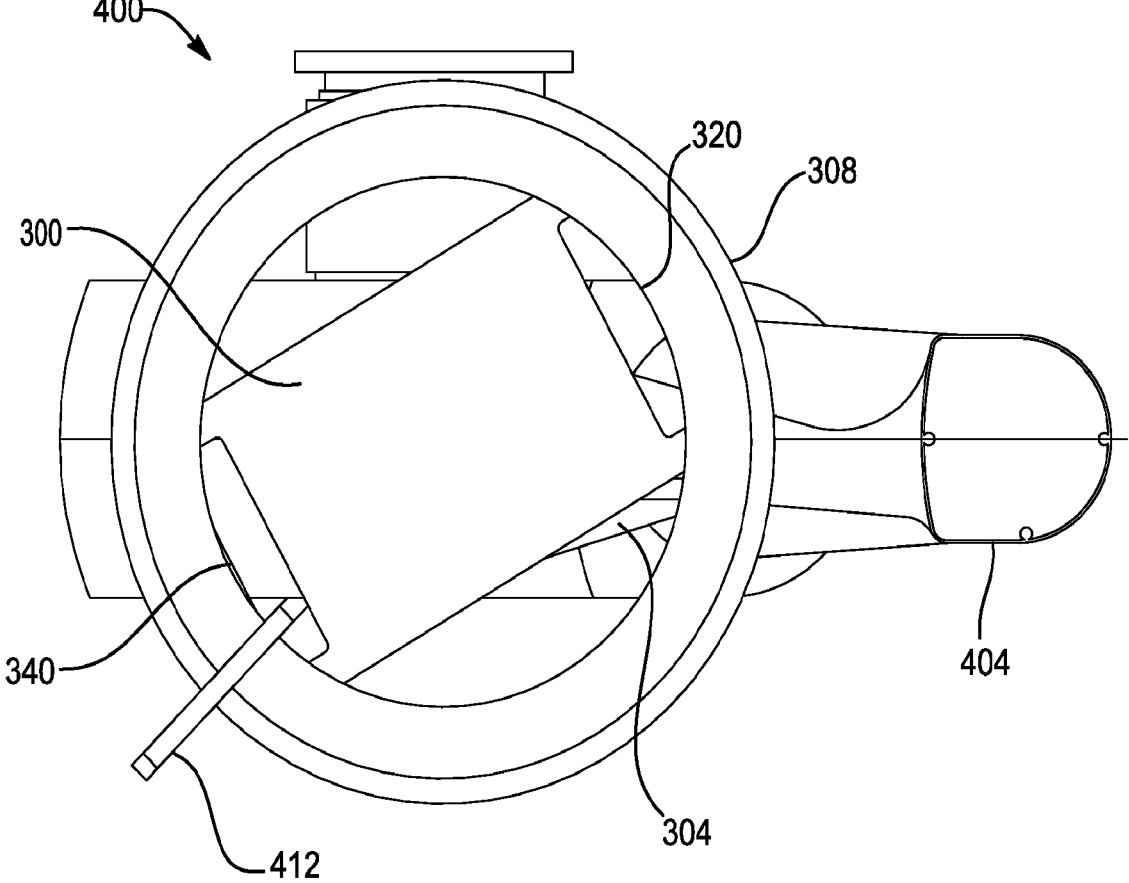
FIGS. 4A, 4B, and 4C illustrate a robot assembly configured to align an edge ring using a carrier plate according to the present disclosure.
Figure 4B:
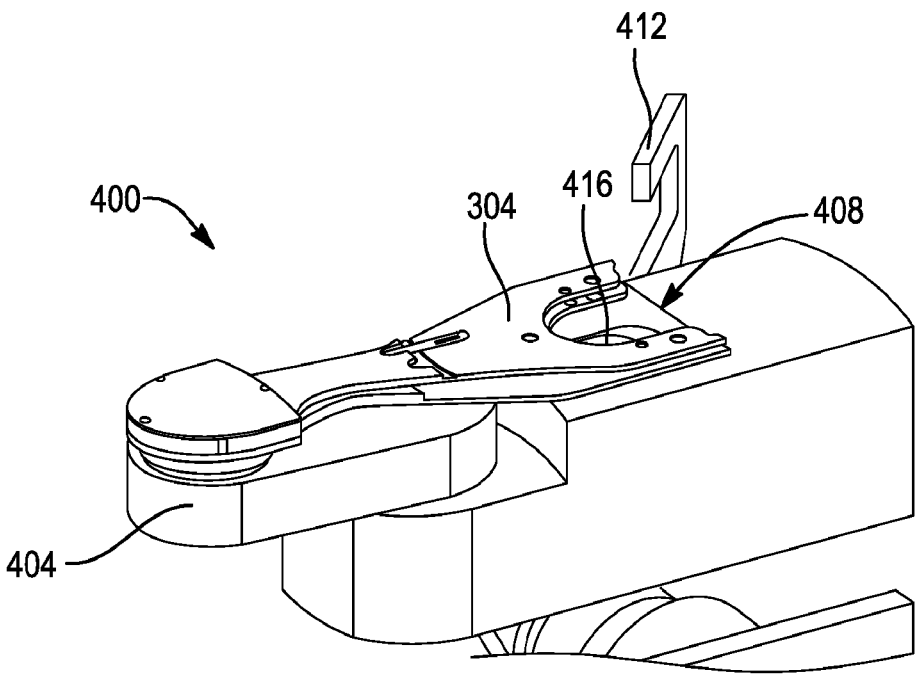
Figure 4C:
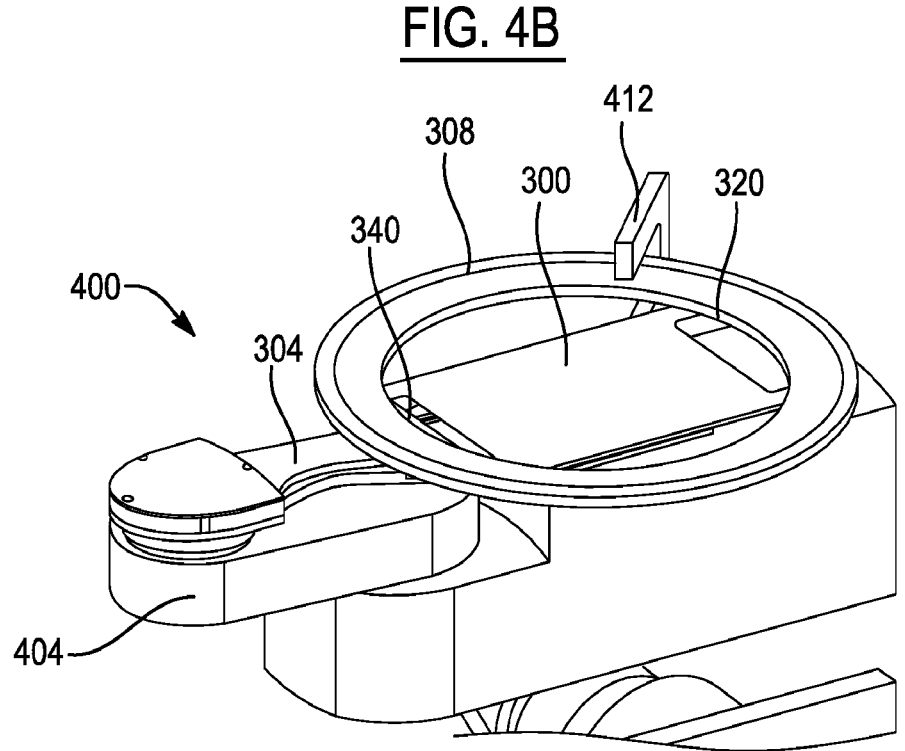

Referring now to FIGS. 4A, 4B, and 4C and with continued reference to FIGS. 3A, 3B, and 3C, an example edge ring transfer and alignment process according to the present disclosure is described. A robot assembly 400 may include a robot 404, a substrate aligner 408, and an integrated sensor or imaging device 412. Although shown as being integrated with the substrate aligner 408, in other embodiments the imagine device 412 or sensor may be provided in a different location (i.e., remotely located and not integrated with the substrate aligner 408). The robot 404 retrieves the carrier plate 300 using the end effector 304. For example, the robot 404 retrieves the carrier plate 300 from a buffer or other storage location within the EFEM 108. The robot 404 uses the end effector 304 with the supported carrier plate 300 to retrieve the edge ring 308. For example, the robot 404 retrieves the edge ring 308 from one of the loading stations 106.

With the edge ring 308 supported on the end effector 304 using the carrier plate 300, the robot 404 positions the edge ring 308 above the substrate aligner 408. For example, the robot 404 may transition to a home or folded position as shown in FIGS. 4A and 4C. In the folded position, the edge ring 308 is positioned above the substrate aligner 408. The substrate aligner 408 may include a chuck 416 configured to rise upward to lift the carrier plate 300 and edge ring 308 off of the end effector 304. In some examples, the chuck 416 may grip the carrier plate 300 (e.g., using vacuum suction) to secure the carrier plate 300 to the substrate aligner 408.

With the carrier plate 300 and edge ring 308 in a raised position, the chuck 416 may rotate the edge ring 308 within a viewing area of the imaging device 412 to detect a rotational position of the edge ring 308 relative to the end effector 304. For example, the carrier plate 300 and/or the edge ring 308 may include one or more features that are detectable by the imaging device 412, such as the flat region 340 on the inner diameter 320 of the edge ring 308. In other examples, the imaging device 412 may be configured to detect one or more other features including, but not limited to, markings on the edge ring 308, a notch in the edge ring 308, markings on the carrier plate 300, annular edges of the edge ring 308, edges of the carrier plate 300, the tabs 324, etc.

In examples where the imaging device 412 is configured to detect the flat region 340, the carrier plate 300 may be sized such that the edge of the carrier plate 300 adjacent to the flat region 340 is not within the viewing area of the imagine device 412. Accordingly, the imaging device 412 does not inadvertently detect the edge of the carrier plate 300 instead of the flat region 340.

In some examples, the controller 204, DA module 224, and/or imaging device 212, 412 may be configured to operate in different modes depending on whether the substrate aligner 408 is aligning a substrate or an edge ring. For example, a substrate may have a first type of detectable feature (e.g., a notch or marking) while an edge ring has a second type of detectable feature (e.g., the flat region 340 or different type of marking). Accordingly, the controller 204, DA module 224, and/or imaging device 212, 412 may be configured to operate in a substrate mode to detect features on a substrate being aligned on the substrate aligner 408 and in an edge ring mode to detect features on an edge ring being aligned on the substrate aligner 408.

The substrate aligner 408 rotates the carrier plate 300 until the detected feature indicates that the edge ring 308 is in a desired rotational position and then lowers the carrier plate 300 and edge ring 308 onto the end effector 304. For example, the DA module 224 may control the substrate aligner 408 to rotate the carrier plate 300 based on signals received from the imaging device 412. In some examples, the substrate aligner 408 may also be configured to perform a linear adjustment of a position of the edge ring 308 relative to the end effector 304. For example, the substrate aligner 408 may adjust a linear position of the edge ring 308 to facilitate centering of the edge ring 308 on the substrate support 120. The robot 404 then transfers the carrier plate 300 and edge ring 308 to the load lock 112 (e.g., for retrieval of the edge ring 308 by the vacuum transfer robot 114 and transfer to the substrate support 120).

Subsequent to transferring the edge ring 308 to the load lock 112, the robot 404 may optionally transfer the carrier plate 300 for centering and rotational alignment prior to being returned to the buffer for storage. The carrier plate 300 alone (i.e., without the edge ring 308 present) may be aligned prior to retrieving the edge ring 308, subsequent to transferring the edge ring 308, etc. For example, as described above, the rounded corners 336 define a perimeter or arc that corresponds to a diameter of the substrate. Accordingly, the rounded corners 336 can be detected to facilitate detection and alignment of the carrier plate 300 on the end effector 304. In some examples, subsequent to aligning the carrier plate 300, the carrier plate 300 may be adjusted to a different alignment (i.e., a rotational alignment offset from a nominal alignment). For example, depending on system geometry and dimensions, dimensions of the carrier plate 300 may obstruct transfer of the edge ring 308 (e.g., transfer of the edge ring 308 through slots of the loading station 106, the EFEM 108, the load lock 112, the VTM 116, the processing chamber 104, etc.). Accordingly, the rotational alignment of the carrier plate 300 on the end effector 304 may be adjusted to a desired angle for facilitating passage of the carrier plate 300 through respective slots.

In some examples, the robot 404 and the substrate aligner 408 may be configured to perform additional steps to align the edge ring 308. For example, if a rotation range of the substrate aligner 408 is limited and/or other structural limitations of the end effector 304, the robot assembly 400, etc. prevent additional rotation, the robot 404 and the substrate aligner 408 may perform additional alignment cycles. For example, the robot 404 may retrieve the edge ring 308 from the substrate aligner 408 subsequent to a first rotation and then place the edge ring 308 on the substrate aligner 408 for additional rotation.

In another example, the robot 404 may adjust an angle of approach of the end effector 304 for retrieving the edge ring 308 from the substrate aligner 408. In still another example, the robot 404 may retrieve the edge ring 308 from the substrate aligner 408 subsequent to rotation, place the edge ring 308 in a storage location such as a buffer or shelf, retrieve the edge ring 308 from the storage location using an adjusted angle of approach, and returning the edge ring 308 to the substrate aligner 408 for additional rotation.

Figure 5:
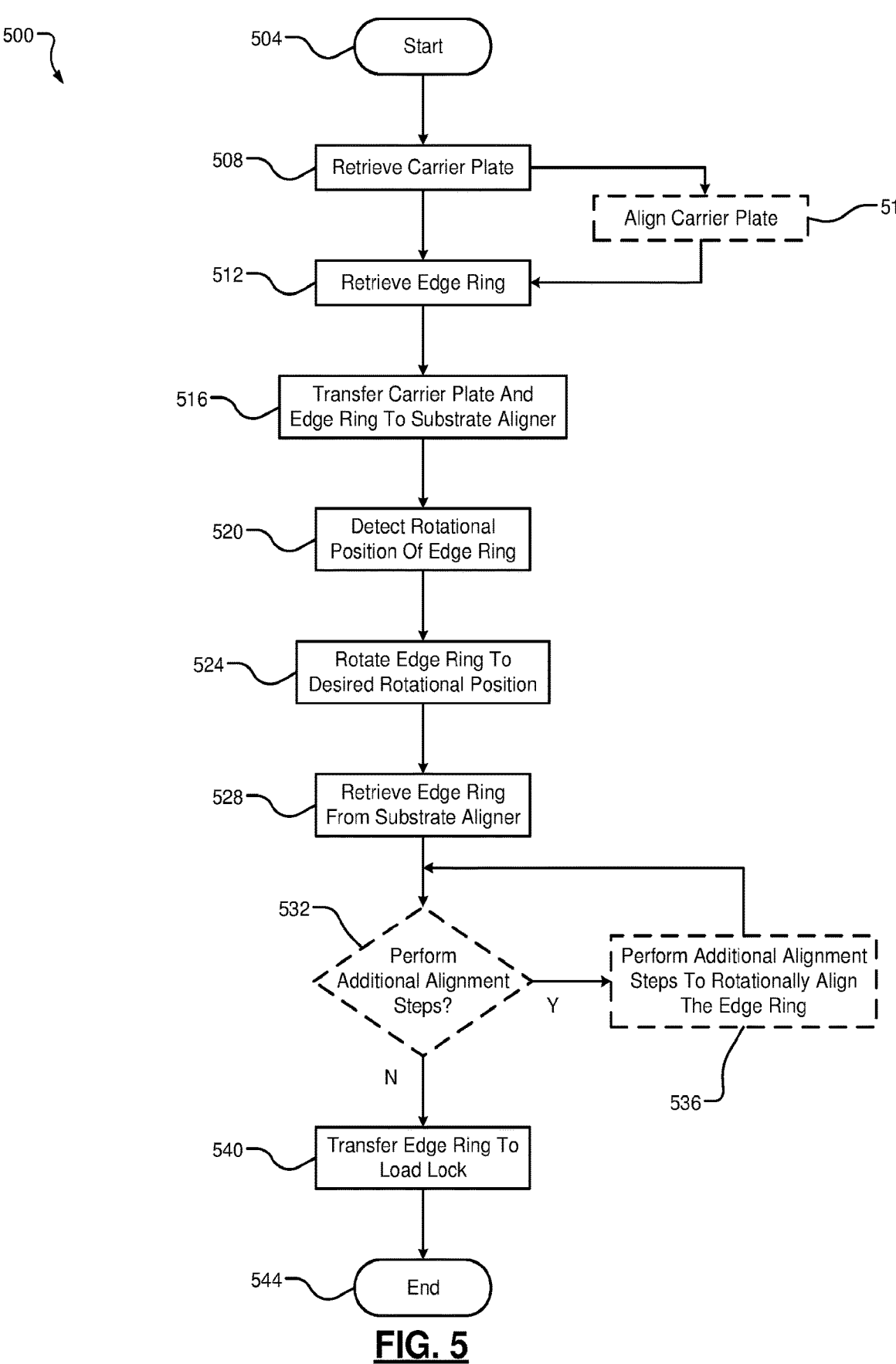
FIG. 5 illustrates steps of an example method for aligning an edge ring according to the present disclosure.

Referring now to FIG. 5, an example method 500 for aligning an edge ring according to the present disclosure begins at 504. At 508, the method 500 retrieves the carrier plate 300 (e.g., using an end effector of a robot such as the robot 404) from a buffer or other storage location. At 510, the method 500 optionally aligns the carrier plate 300 on the end effector as described above. At 512, the method 500 (e.g., the robot 404) uses the end effector with the supported carrier plate to retrieve an edge ring from a loading station. At 516, the method 500 (e.g., the robot 404) transfers the edge ring to a substrate aligner. For example, the robot 404 positions the edge ring above the substrate aligner and a chuck of the substrate aligner is raised upward to lift the carrier plate and edge ring off of the end effector.

At 520, the method 500 (e.g., the imaging device) detects a rotational position of the edge ring relative to the end effector. For example, the imaging device detects one or more features (e.g., a flat region) of the edge ring and determines the rotational position based on the detected features. At 524, the method 500 (e.g., using the substrate aligner, the imaging device, and/or the DA module 224) rotates the carrier plate until the detected feature indicates that the edge ring is in a desired rotational position. At 528, the method 500 (e.g., the robot 404) retrieves the carrier plate and edge ring from the substrate aligner. For example, the substrate aligner lowers the carrier plate and edge ring onto the end effector.

At 532, the method 500 (e.g., the DA module 224) optionally determines whether to perform additional steps to align the edge ring. For example, the method 500 may determine whether additional rotation of the edge ring is required. If true, the method 500 continues to 536. If false, the method 500 continues to 540. At 536, the method 500 performs one or more additional steps to align the edge ring. For example, the robot 404 may retrieve the edge ring from the substrate aligner subsequent to a first rotation and then place the edge ring on the substrate aligner for additional rotation, adjust an angle of approach of the end effector for retrieving the edge ring from the substrate aligner, may retrieve the edge ring from the substrate aligner subsequent to rotation, place the edge ring in a storage location such as a buffer or shelf, retrieve the edge ring from the storage location using an adjusted angle of approach, and returning the edge ring to the substrate aligner for additional rotation, etc.

In some examples, subsequent to retrieving the edge ring from the substrate aligner, the robot 404 may return the edge ring to a storage location, return the carrier plate to the substrate aligner, realign the carrier plate on the end effector, and then again retrieve the edge ring. In other words, a rotational alignment of the carrier plate on the end effector may be adjusted prior to retrieving the edge ring to change a rotational alignment of the carrier plate relative to the edge ring. Changing the alignment of the carrier plate relative to the edge ring may facilitate movement of the carrier plate through slots, around system geometry, etc. as described above.

At 540, the method 500 (e.g., the robot 404) transfers the edge ring to a load lock for retrieval of the edge ring by a vacuum transfer robot and transfer to the substrate support. The method 500 ends at 544.

In other examples, systems and methods according to the present disclosure may be configured to implement other alignment steps. In one example, rotational and/or linear alignment may be performed based on features detected on a top and/or bottom surface of an edge ring. Some edge rings may include detectable features, while other edge rings may be comprised of an optically "clear" material (i.e., a material or surface that is undetectable using some types of sensors). Accordingly, surfaces of an edge ring may be intentionally roughened to facilitate detection. In examples where surfaces of edge rings are intentionally roughened, these surfaces may become polished over time due to exposure to a processing environment within a chamber. For example, if an edge ring is moveable (i.e., configured to be raised and lowered for process tuning), raising the edge ring may expose lower surfaces of the edge ring to the process environment. The polishing of the surfaces of the edge ring in this manner interferes with accurate detection of a position of the edge ring.

Figure 6:
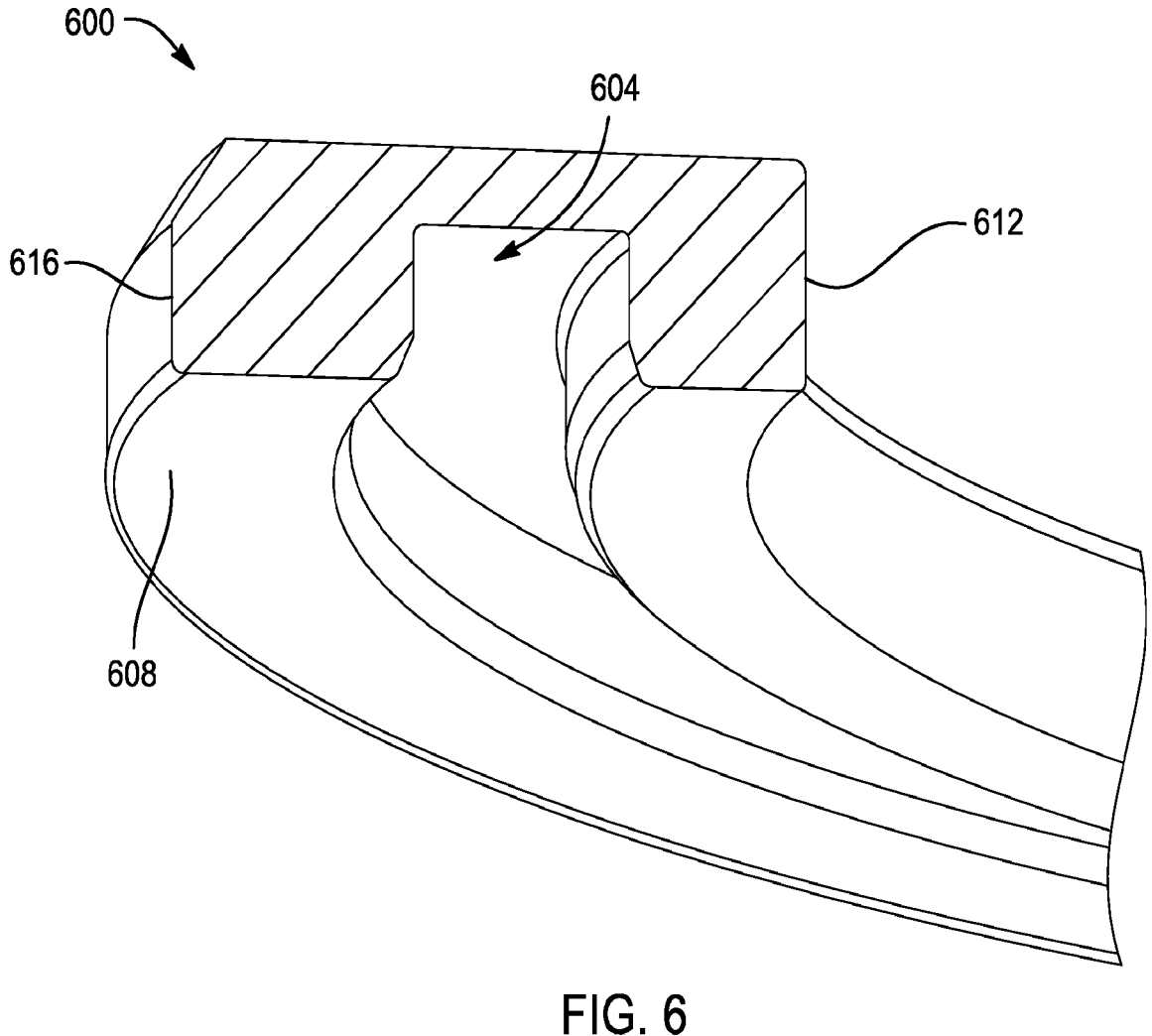
FIG. 6 is an example edge ring including a groove according to the present disclosure.

As shown in FIG. 6, an example edge ring 600 (shown in cross-section) may include a groove 604 formed in a lower surface 608. Dynamic alignment systems and methods according to the principles of the present disclosure may be configured to detect the position of the edge ring 600 by detecting the groove 604. The groove 604 is located between an inner diameter 612 and an outer diameter 616 of the edge ring 600. The lower surface 608 may be polished to increase a contrast between the lower surface 608 and the groove 604. Accordingly, a DA module (e.g., the DA module 224) may be configured to detect the groove 604 based on signals received from corresponding sensors. For example, raw sensor data of the lower surface 608 may be provided to the DA module 224 for processing. The DA module 224 may implement an algorithm and/or filter configured to identify the groove 604 in the raw sensor data and determine respective locations of the inner diameter 612 and the outer diameter 616 to determine a location of the edge ring 600 and a linear offset of the location of the edge ring 600 relative to a desired (e.g., centered) position.

As an example, the DA module 224 may be configured to separate the captured raw sensor data into four vectors. For example, the DA module 224 may receive data captured from two sensors (e.g., a right sensor and a left sensor). The captured data may be separated into data corresponding to a leading edge (e.g., an outer diameter of the groove 604) detected by the right sensor, a trailing edge (e.g., an inner diameter of the groove 604) detected by the right sensor, a leading edge detected by the left sensor, and a trailing edge detected by the left sensor.

The DA module 224 calculates edge points (e.g., points on the outer diameter 616) of the edge ring 600 based on the leading edge and trailing edge data captured for the groove 604 and further based on calibrated positional data of the sensors, the robot, etc. In some examples, any calculated edge point by be removed from the data if a corresponding radial value is outside of a predetermined range (e.g., less than a predetermined minimum value or greater than a predetermined maximum value). The DA module 224 then calculates a diameter and a corresponding offset (i.e., from a desired centered position) of the position of the edge ring 600.

As shown in another example in FIGS. 7A, 7B, and 7C, an edge ring 700 (as shown from a bottom view in FIG. 7A) may include one or more alignment features, such as notches 704. For example, the notches 704 are shown in a bottom surface 708 of the edge ring 700 and extend upward toward a top surface 712 of the edge ring 700. The notches 704 may be configured to facilitate alignment of the edge ring 700 relative to other structural features of a substrate support. For example, the notches 704 are arranged to receive alignment pins, lift pins, etc. extending upward from the substrate support. The notches 704 may have sloped or triangular inner surfaces (as shown in a view of an inner diameter 716 of the edge ring 700 in FIG. 7B), a rounded inner surface (as shown in the view of the inner diameter 716 in FIG. 7C), etc. The inner surface of the notches 704 facilitates alignment of the edge ring 700.

Dynamic alignment systems and methods according to the principles of the present disclosure as described above may be further configured to detect the position of the edge ring 700 by detecting the notches 704. For example, a sensor such as the imaging device 412 may be configured to detect one or more of the notches 704 and the DA module 224 may be configured to determine an alignment of the edge ring 700 based on the detected notches 704.

A cross-sectional view of another example edge ring 800 is shown in FIG. 8A. A top-down view of a portion of the edge ring 800 is shown in FIG. 8B. In this example, the edge ring 800 is comprised of a transparent or semi-transparent material (e.g., quartz). In other words, light can be transmitted through the edge ring 800. For example, light may be transmitted from one side of the edge ring 800 (e.g., transmitted from below the edge ring 800 using a suitable transmitter, LED, etc.) and received on an opposite side of the edge ring 800 (e.g., using the imaging device 412 or another suitable sensor).

The edge ring 800 may include an optical notch or window 804. For example, the window 804 may be located in a stepped portion 808 of the edge ring 800 that defines a substrate pocket at an inner diameter 812 of the edge ring 800. The window 804 is configured to have a different transparency (or, opacity) than other portions of the edge ring 800. Accordingly, one or more characteristics (e.g., a gain) of a beam of light transmitted through the window 804 and received by a sensor will be different than characteristics of a beam of light transmitted through other portions of the edge ring 800. In this manner, dynamic alignment systems and methods according to the principles of the present disclosure as described above may be further configured to detect the position of the edge ring 800 by detecting the window 804. For example, the DA module 224 may be configured to determine an alignment of the edge ring 800 based on the detected window 804.

For example, the window 804 may correspond to a portion of the edge ring 800 that is polished or roughened relative to other portions of the edge ring 800. In one embodiment, an upper surface 816 of the edge ring 800 is polished. Conversely, an upper surface 820 of the stepped portion 808 is not polished (or roughened) while surfaces of the window 804 are polished (e.g., laser polished). In other words, the window 804 has a greater transparency than other portions of the stepped portion 808 to facilitate detection of the window 804.

As shown in a top down-view of the stepped portion 808 in FIG. 8B, an upper portion 824 of the window 804 that is polished on the upper surface 820 of the stepped portion 808 may have a different size and/or shape than a lower portion 828 of the window 804 that is polished on a lower surface 832 of the stepped portion 808. For example, the upper portion 824 may have a generally triangular shape (as shown), a rounded shape, etc. Conversely, the lower portion 828 may be generally rectangular. The lower portion 828 may have a larger perimeter than the upper portion 824 to permit a greater amount of light to be transmitted upward through the window 804 to facilitate detection.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/ or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system, comprising:
a carrier plate configured to support an edge ring;
a robot configured to transfer the carrier plate and the edge ring within a substrate processing system;
an imaging device including a sensor configured to:
project one or more beams toward an end effector of the robot;
sense when the edge ring interrupts the beams; and
determine a position of the edge ring on the end effector based on a pattern indicative of which beams are interrupted;
a controller configured to:
receive position data comprising the pattern from the imaging device;
determine a rotational position of the edge ring relative to the end effector based on the position data; and
determine a rotational offset between the rotational position of the edge ring and a desired rotational position of the edge ring by comparing the pattern to a predetermined pattern indicative of the desired rotational position of the edge ring on the end effector; and
a substrate aligner including a vacuum chuck configured to adjust the rotational position of the edge ring relative to the end effector of the robot by rotating the carrier plate based on the rotational offset.

2. The system of claim 1, wherein the imaging device configured to detect a feature of the edge ring while the edge ring and the carrier plate are arranged on the substrate aligner.

3. The system of claim 2, wherein the feature is a flat region of an inner diameter of the edge ring.

4. The system of claim 2, wherein surfaces of the edge ring are generally polished and the feature corresponds to at least one of an unpolished and roughened portion of the edge ring.

5. The system of claim 2, wherein surfaces of the edge ring are generally unpolished and the feature corresponds to a polished portion of the edge ring.

6. The system of claim 2, wherein the feature includes at least one of (i) a notch arranged on a bottom surface of the edge ring or (ii) a window provided in the edge ring, wherein the window permits transmission of light through the edge ring.

7. The system of claim 2, wherein (i) the edge ring is coated and the feature corresponds to an uncoated portion of the edge ring or (ii) the edge ring is uncoated and the feature corresponds to a coated portion of the edge ring.

8. The system of claim 2, wherein the substrate aligner is configured to rotate the carrier plate and the edge ring based on the feature of the edge ring detected by the imaging device.

9. The system of claim 1, wherein the substrate aligner is configured to rotate the carrier plate and the edge ring based on the desired rotational position of the edge ring relative to the end effector.

10. The system of claim 1, wherein the carrier plate includes a plurality of tabs extending from respective corners of a body of the carrier plate, wherein a perimeter of the body is smaller than an inner diameter of the edge ring and the plurality of tabs extend beyond the inner diameter of the edge ring.

11. The system of claim 10, wherein at least two of the plurality of tabs includes an elastomeric pad.

12. The system of claim 10, wherein a bottom surface of the carrier plate includes a contact sheet comprised of a thermoplastic material.

13. The system of claim 12, wherein the contact sheet is arranged in a recess in the bottom surface of the carrier plate.

14. The system of claim 1, wherein the carrier plate includes rounded corners.

15. The system of claim 14, wherein the rounded corners of the carrier plate define a perimeter corresponding to a diameter of a substrate when present.

16. The system of claim 15, wherein the diameter is approximately 300 mm.

17. A system, comprising:

a carrier plate configured to support an edge ring;

a robot configured to transfer the carrier plate and the edge ring within a substrate processing system;

an imaging device including a sensor configured to:

project one or more beams toward an end effector of the robot;

sense when the edge ring interrupts the beams; and determine a position of the edge ring on the end effector based on a pattern indicative of which beams are interrupted;

a controller configured to:

receive position data comprising the pattern from the imaging device;

determine a rotational position of the edge ring relative to the end effector based on the position data; and determine a rotational offset between the rotational position of the edge ring and a desired rotational position of the edge ring by comparing the pattern to a predetermined pattern indicative of the desired rotational position of the edge ring on the end effector; and a substrate aligner including a vacuum chuck configured to adjust the rotational position of the carrier plate relative to the end effector of the robot by rotating the carrier plate based on the rotational offset.

18. The system of claim 17, wherein the substrate aligner is configured to retrieve the edge ring with the rotated carrier plate.

19. The system of claim 17, wherein the substrate aligner is configured to further adjust the rotational position of the carrier plate before returning the carrier plate to a buffer.

20. The system of claim 17, wherein the robot is configured to retrieve the carrier plate with the end effector, retrieve the edge ring using the carrier plate supported on the end effector, and transfer the carrier plate and the edge ring to the substrate aligner.

21. The system of claim 1, wherein the robot is configured to retrieve the carrier plate with the end effector, retrieve the edge ring using the carrier plate supported on the end effector, and transfer the carrier plate and the edge ring to the substrate aligner.

22. The system of claim 2, wherein the system further comprises a substrate support, wherein the edge ring is arranged around an outer portion of the substrate support, wherein the substrate aligner is configured to adjust the rotational position of the edge ring to align the feature of the edge ring to the feature of the substrate support.

23. The system of claim 2, wherein the system further comprises a substrate support, wherein the edge ring is arranged around an outer portion of the substrate support, wherein the feature includes a plurality of notches and wherein the substrate aligner is configured to adjust the rotational position of the edge ring to align the notches to receive lift pins through the substrate support.

24. The system of claim 1, wherein the system further comprises a substrate support, wherein the edge ring is arranged around an outer portion of the substrate support, wherein the substrate aligner is configured to adjust a linear position of the edge ring for centering of the edge ring on the substrate support.

25. The system of claim 1, wherein the robot is configured to adjust an angle of approach of the end effector to retrieve the edge ring from the substrate aligner.

26. The system of claim 1, wherein the substrate aligner is configured to detect a feature on a substrate and to align the substrate based on the detected feature.

\* \* \* \* \*